United States Patent
Dray et al.

(10) Patent No.: US 8,335,121 B2
(45) Date of Patent: Dec. 18, 2012

(54) METHOD FOR IMPLEMENTING AN SRAM MEMORY INFORMATION STORAGE DEVICE

(75) Inventors: Cyrille Dray, Grenoble (FR); Francois Jacquet, Froges (FR); Sébastien Barasinski, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 209 days.

(21) Appl. No.: 12/829,675

(22) Filed: Jul. 2, 2010

(65) Prior Publication Data

US 2010/0265758 A1 Oct. 21, 2010

Related U.S. Application Data

(62) Division of application No. 11/617,336, filed on Dec. 28, 2006, now Pat. No. 7,751,229.

(51) Int. Cl.
*G11C 7/02* (2006.01)
(52) U.S. Cl. ............ 365/210.1; 365/154; 365/189.07
(58) Field of Classification Search .......... 365/154, 365/189.07, 210.1
See application file for complete search history.

(56) References Cited

U.S. PATENT DOCUMENTS

| | | | |
|---|---|---|---|
| 5,726,944 A | 3/1998 | Pelley, III et al. | |
| 6,147,898 A | 11/2000 | Yamada | |
| 7,394,714 B2 | 7/2008 | Lin et al. | 365/227 |
| 7,468,903 B2 | 12/2008 | Wang et al. | 365/154 |
| 2004/0008550 A1 | 1/2004 | Son et al. | |

FOREIGN PATENT DOCUMENTS

EP 0 638 903 A2 2/1995

OTHER PUBLICATIONS

Preliminary Search Report dated Oct. 6, 2006 for French Application No. 0513326.

*Primary Examiner* — Kretelia Graham
(74) *Attorney, Agent, or Firm* — Lisa K. Jorgenson; Stephen Bongini; Fleit Gibbons Gutman Bongini & Bianco P.L.

(57) ABSTRACT

A device, and a corresponding method of implementation, for SRAM memory information storage are provided. The device is powered by a supply voltage and includes an array of base cells organized in base columns, and at least one mirror column of at least one mirror cell liable to simulate the behavior of the cells in a base column. The device further includes Emulation means, in a mirror column, of the most restricting cell in a base column, Means for varying a mirror power supply voltage for the mirror column, and Means for copying the mirror power supply voltage in the emulated base column.

17 Claims, 6 Drawing Sheets

METHOD FOR IMPLEMENTING AN SRAM MEMORY INFORMATION STORAGE DEVICE

CROSS-REFERENCE TO RELATED APPLICATIONS

This is a divisional of application Ser. No. 11/617,336, filed Dec. 28, 2006, now U.S. Pat. No. 7,751,229. The entire disclosure of prior application Ser. No. 11/617,336 is herein incorporated by reference.

FIELD OF THE INVENTION

The present invention generally relates to random access memory data storage devices and in particular SRAM (Static Random Access Memory) memory cells.

More specifically, the invention relates to an SRAM data storage device powered by a voltage (VDD), comprising:

a base cell array organized in base columns powered by a supply (VDDM) and means for varying the power supply voltage (VDDM) for the base column for a base cell selected for information storage.

BACKGROUND OF THE INVENTION

The dynamic power consumed by a device is a function of the square of its power supply voltage. In order to save power, it is desirable for the supply voltage to be low.

Static memories are very sensitive to the power supply voltage, a slight variation being able to cause errors or even to cause the entire system fail. Moreover, too low a power supply voltage leads to information loss when the power supply voltage is below the minimum memory retention voltage value.

Thus within complex systems of the "System on Chip"-type consisting of SRAM embedded memory, it is a question of making sure that the performance as regards dynamic consumption reduction are not limited by the SRAM memory or memories.

Furthermore, in memory cell array devices, the column structure requires that the power supply voltage (VDDM) for a column is the same for all the cells in the column. This structure also requires a "weak link" principle, that is to say that the properties of the most restricting cell have an impact on the whole column containing it, in particular by its minimum retention voltage.

Moreover, memory cell allows to carry out either read operation or write operation to which operation margins are associated. These margins are called respectively "Static Noise Margin" and "Write Margin" in Anglo-Saxon material. These margins are antagonistic.

Thus, the lower the power supply voltage is, the lower the operation margin is. More exactly, it is the dispersion in the margin value which is detrimental. In fact, the margins are relatively insensitive to variations in the power supply voltage but ever higher dispersions lead to ever more limited variation problems in the power supply voltage.

The present invention comes under the framework of devices providing the means for carrying out low-voltage write operations, that is to say, for a given technology, lower than the rated voltage. For example, for a rated voltage of 1.2V, performing write operations at 0.7V.

All systems are currently aiming at a reduction in memory sizes. However a reduction in the size of the components increases their dispersion. Indeed, there is high electrical variability in the transistors which have an impact on a memory cell's reading and writing margins.

A memory cell's power supply depends in particular on the "PVT" (Process Voltage Temperature) conditions for the system (circuit) incorporating it, that is to say the technological process, voltage and temperature conditions.

Because of these constraints (PVT, operation margins, local mismatches or separation), a cell's power supply voltage VDDM has to be varied in order to promote reading or writing. Typically, a reduction in the power supply voltage promotes write operations and conversely an increase in the power supply voltage favors a memory cell's read operations.

The present invention comes under the framework of devices intended to favor the write margin, reading being operational over a wide range of voltages.

Such a device is known to those skilled in the art, in particular through the example given in the document U.S. Pat. No. 6,954,396 for state of the prior art.

This document describes a device comprising means for under-volting the power supply voltage VDDM for the cells so as to promote write operations, and means for over-volting the power supply voltage VDDM for the cells so as to promote read operations. These means allows to establish static polarizations for the read and write phases.

The means required for over-volting are costly in power and run counter to the reduction in dynamic consumption desired.

SUMMARY OF THE INVENTION

The object of the present invention is to provide a solution to these problems by providing a device designed to optimize the power supply voltage VDDM required for memory cell writing.

With this objective in mind, the device according to the invention, which moreover complies with the preamble above, is essentially characterized in that the means of varying the power supply voltage (VDDM) for a column comprise:

emulation means, in a mirror column comprising at least one mirror cell provided with internal nodes, for the most restricting cell in the column comprising the selected base cell, means for varying the mirror power supply voltage for the mirror column, and means for copying the mirror power supply voltage in the base column comprising the selected base cell.

The mirror column preferably comprises at least one other mirror cell so as to constitute a plurality P of mirror cells placed in parallel and a number N of activated mirror access transistors.

The mirror cells are placed in parallel for example by sharing a connection line to the same internal nodes (BLTiMOCK and BLFiMOCK).

In the preferred embodiment, the ratio N/P between the number of activated mirror access transistors and the number of mirror cells placed in parallel is a function of the power supply voltage for the storage device.

As an alternative, and in a combinable fashion, at least one mirror cell in the mirror column is an SRAM cell comprising access transistors and core transistors for which the threshold voltage of at least one of them is different from the threshold voltage for a transistor of the same type in a base cell.

Type is understood to mean a transistor of "access" or "core" type, independently of their NMOS or PMOS configuration.

The threshold voltage of access transistors for a memory cell is preferably higher than the threshold voltage for access transistors in a base cell.

Furthermore, in parallel fashion, the absolute values of the threshold voltages for core transistors in a mirror cell are preferably lower than the absolute values of the threshold voltages for the core transistors in a base cell.

A mirror column comprises to advantage several mirror cells which are identical to each other. The mirror cells are preferably SRAM cells identical to the base cells in the base columns.

The means of varying the mirror power supply voltage VDDMOCK preferably comprise a feedback loop connected to at least one of the internal nodes (BLTiMOCK, BLFiMOCK).

The invention also relates to a method for implementing an SRAM memory information storage device organized in a base cell array comprising the steps of:

selecting a base cell in a base column for information storage, emulating, in a mirror column comprising at least one mirror cell provided with internal nodes, the most restricting cell in writing in the base column comprising the selected base cell, applying an initial mirror power supply voltage to the mirror column, gradually decreasing the initial mirror voltage until detection of the switching of the whole of at least one mirror cell in the mirror column, copying the mirror voltage in the base column, and then gradually increasing the mirror power supply voltage up to the initial mirror voltage.

Through this arrangement, the device according to the invention allows to perform low voltage write operations for SRAM memory.

In the preferred embodiment, the emulation step comprises placing a plurality P of mirror cells in parallel.

They are preferably placed in parallel by sharing the connection lines to the internal nodes (BLFiMOCK, BLTiMOCK).

The mirror cells placed in parallel are preferably selectively activated by N access transistors.

As an alternative, and in a combinable fashion, the emulation step comprises, for at least one transistor for at least one mirror cell, the creation of a threshold voltage different from that for a transistor of the same type in a base cell.

The threshold voltage for the access transistors for a memory cell is preferably higher than the threshold voltage for access transistors for a base cell.

Furthermore, in parallel fashion, the absolute values of the threshold voltages for the core transistors for a mirror cell are preferably lower than the absolute values for the threshold voltages for core transistors for a base cell.

The decrease and increase in the mirror voltage are preferably achieved by a feedback loop connected to at least one of the internal nodes of the mirror cell or cells.

The method according to the invention may also be implemented to advantage when the power supply voltage for the device is close to the rated voltage.

Through this configuration, the voltage to be applied to a base column to perform an operation may be determined dynamically, by a dynamic adaptation to the PVT conditions.

The method according to the invention is implemented to advantage on each write operation in a base column.

BRIEF DESCRIPTION OF THE DRAWINGS

Other features and advantages of the present invention will appear more clearly upon reading the following specification which is given as an illustrative, non-restrictive example and refers to the appended figures in which.

DETAILED DESCRIPTION

Figure 1A:
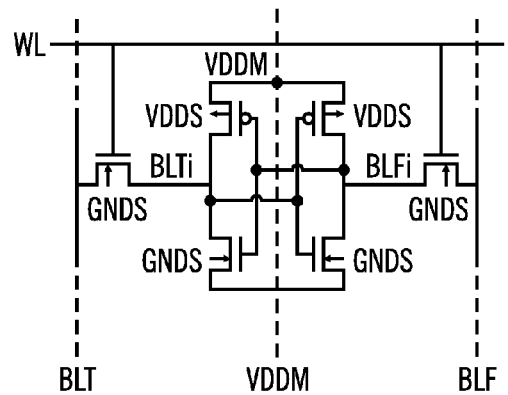
FIG. 1a is a diagrammatic representation of a conventional SRAM cell.

As represented in FIG. 1a, an SRAM cell is typically composed of two access transistors and a latch, or core, with four transistors, two PMOS and two NMOS forming two inverters. Each inverter has its output connected to the input of the other inverter.

The two access transistors, the substrate of which is at the ground potential GNDS, can be activated by a word selection line WL. The first access transistor is connected to a bit selection line BLT and the second access transistor is connected to a complementary bit selection line BLF.

The connection point between the first access transistor and a first transistor pairing (NMOS, PMOS) for the core defines a first internal node BLTi. The second connection point between the second access transistor and the second transistor pairing (NMOS, PMOS) for the core defines a second, complementary internal node BLFi.

In the present specification, BLTi and BLFi define either the internal nodes or the value of the voltage at these points respectively.

The power supply voltage VDDM for the core of a cell is no more than the device power supply voltage VDD.

Figure 1B:
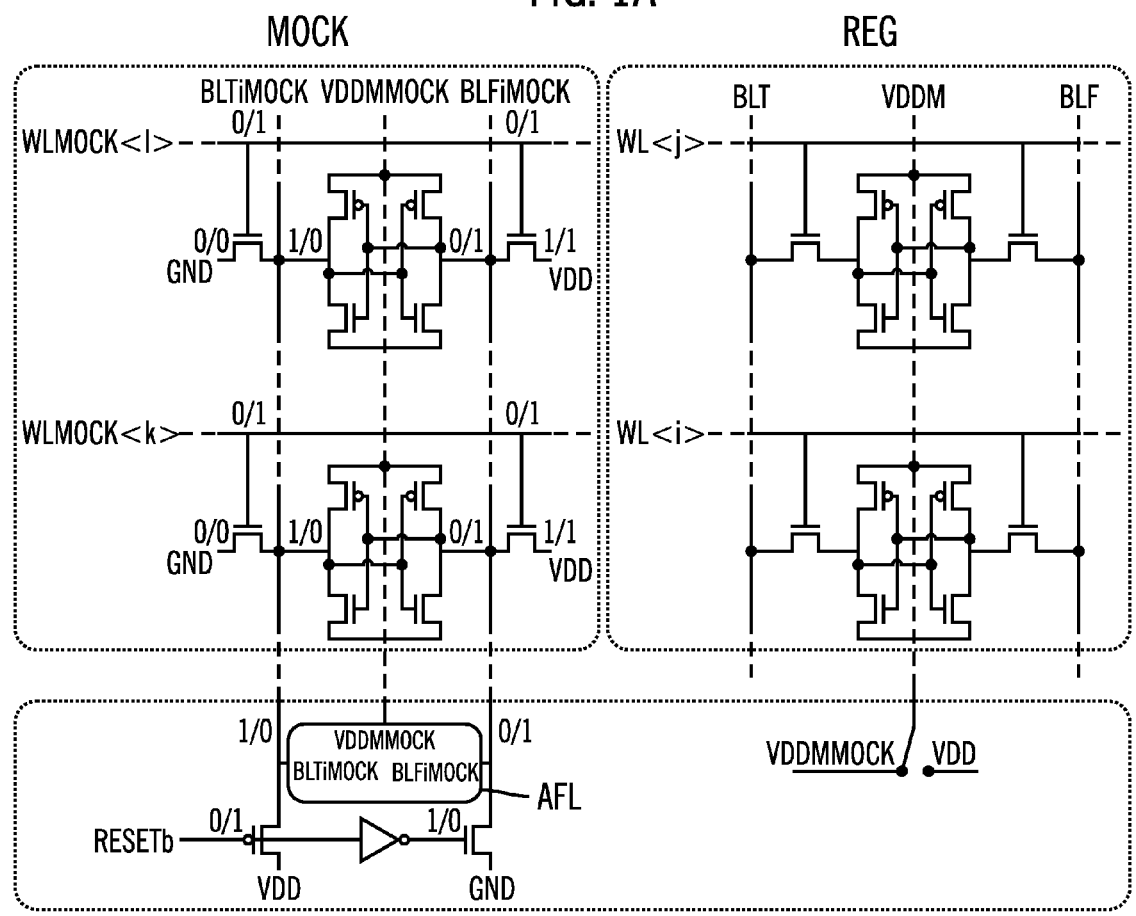
FIG. 1b is a diagrammatic representation of an embodiment of part of the device according to the invention.

As represented in FIG. 1b, the SRAM memory information storage device comprises an array of base cells, of which only two cells in a base column REG are represented and can be selected by word selection lines WL<j> and WL<i>. The base cells are powered by a power supply voltage VDDM.

Furthermore, the device comprises means of varying that power supply voltage VDDM for the base cells.

These variation means comprise at least one mirror column MOCK. This column comprises at least one mirror cell. The mirror column preferably comprises a plurality of mirror cells. The number of mirror cells in a mirror column is preferably equal to, or less than the number of base cells in a base column. The mirror column allows to simulate the behavior of at least one base cell in a base column.

Through this simulation, a write operation may be performed at the optimum voltage. And the undervoltage created in order to promote cell writing is the undervoltage which is strictly required for that operation, which limits the risk of exposing the cell to its information retention loss voltage.

In the preferred embodiment of the invention, the mirror cells in the mirror column are placed in parallel through their internal nodes. Placing them in parallel thus allows to have a BLTiMOCK line and a complementary BLFiMOCK line linking all the mirror cells in a mirror column, the mirror cells placed in parallel being selectively activated as described below.

Write operation in a cell consist in changing the logical state of that cell's internal nodes. This is a matter of resolving the impedance conflict between the access transistors and the latch so that the access transistors manage to impose the voltage pairing (BLT, BLF) value onto the respective internal nodes (BLTi, BLFi).

On the production of memory cell devices, there are mainly two types of dispersions which affect the cell properties.

The first type relates to overall dispersion due to the technological process. To perform a write operation, the effect consists in implementing write means which are adaptable as regards overall variations in the technological process (element "P" in the PVT conditions referred to above).

The second type relates to local dispersion, that is to say the behavior of a MOS transistor relative to its neighbor once incorporated into a column, which leads to the "weak link" logic referred to above.

The effect of these deviations lies firstly in the fact that a write operation is promoted by decreasing the cell power supply potential VDDM, and secondly that the most restricting cell in a column, that is the cell having the worst write conditions, also called "worst case", affects the write conditions for all the other cells in the column.

One of the objects of this invention thus consists in simulating the most restricting cell in a base cell column in a mirror column.

The most restricting column is the cell having the worst write conditions in a base column, typically the one requiring the lowest power supply voltage VDDM upon writing.

Thus, according to the invention, the simulation in a mirror column of the most restricting base cell in a base column assures that the other base cells in the base column will be correctly powered by the voltage VDDM.

In other words, the mirror column allows to determine the mirror voltage VDDMOCK which is equivalent to the lowest voltage VDDM for which the most restricting cell in a given base column is capable of performing a write operation. This voltage VDDMMOCK is then applied, copied, in the base column comprising the base cell which has to perform the write operation.

The most restricting cell is preferably identified after production of the device during electrical sort tests.

It may also be identified a priori by simulation means, or even statistically.

The emulation in the mirror column allows to reproduce the most restricting cell in a base column.

Several embodiments are possible. The preferred embodiment only is illustrated in FIG. 1b. To simplify this specification, the base cell array is an array with one base column REG, the column comprising two cells. The device furthermore comprises a mirror column MOCK of two mirror cells liable to simulate the behavior of the base cells in the base column.

In this embodiment, the mirror cell internal nodes are placed in parallel through two complementary internal node interconnection lines BLTiMOCK and BLFiMOCK.

For each core of each mirror cell, a pair of access transistors is associated and these cells are controlled by a specific word selection line. In FIG. 1b, the mirror cells are selectively activated by selection of the selection word line or lines WLMOCK<l>, <WLMOCK<k> in the mirror column.

The selection of the number of word selection lines activated thus allows to emulate more or less difficult write conditions. For example, in FIG. 1b, if the word selection line <WLMOCK<l> is at 0 (not selected) and the word selection line <WLMOCK<k> is at 1 (selected), there is an impedance conflict between two access transistors and two latches, thus eight transistors.

One can thus underexploit the number of access transistors which control a fixed number of cores and thus make the write conditions more or less difficult.

The embodiment illustrated in FIG. 1b comprises also a line of transistors controlled by a control signal RESETb. This control allows to force the initial conditions on the interconnection lines for the internal nodes BLTiMOCK and BLFiMOCK as described below.

In this embodiment, the initial conditions for a mirror cell are such that the interconnection line for the internal nodes BLTiMOCK is at 1 and the interconnection line for the internal nodes BLFiMOCK is at 0. The access transistor connected to the line BLTiMOCK is linked to the ground GND whereas the other access transistor linked to the line BLFiMOCK is connected to the circuit power supply VDD.

When a write operation is performed, the line BLTiMOCK is at 0 whereas the line BLFiMOCK is at 1. In this case, the initial conditions (BLTiMOCK at 1 and BLFiMOCK at 0) need to be reset in view of a next write operation. This reset is also illustrated by the corresponding sudden variations in voltages at the cycle end in FIG. 3.

This reset step consumes current. As an alternative, it may be replaced by alternating the potentials on the access transistors. In this case, the access transistor connected to the line BLTiMOCK is then connected to the circuit power supply VDD whereas the other access transistor, connected to the line BLFiMOCK, is connected to ground GND. A new write operation then leads to new potential alternation.

In the preferred embodiment, the number of activated access transistors is defined by N and the number of activated mirror cells placed in parallel by P. The ratio N/P depends to advantage on the power supply voltage VDD for the device.

For transistors of 65nm technology, the ratio N/P is preferably 2/16 for a voltage VDD of 0.7V. This ratio tends to 1 when the power supply voltage VDD for the device tends to the rated voltage (1.2V in this case). Another ratio may be determined by statistical tests.

In the preferred embodiment, the mirror cells are identical to the base cells, which simplifies the manufacture of the device. The mirror column is preferably adjacent to the base array.

A second embodiment may replace or be combined with the first embodiment described above.

The difference in impedance between core transistors of a cell and its access transistors may also be achieved by difference between the respective threshold voltages.

To this end, to make the write conditions more difficult on the cells in a mirror column, the threshold voltage for the access transistors for the mirror cell or cells is to advantage greater than that for the access transistors for a base cell.

In parallel, in addition to or as an alternative, the threshold voltage for the latch transistors for the mirror cell or cells may be less than that for the latch transistors for the base cell.

The difference between the threshold voltages is preferably $6\sigma$, $\sigma$ being the standard deviation for the threshold voltage for the transistors used. The threshold voltages for the core transistors and the access transistors are to advantage decreased by $3\sigma$ and increased by $3\sigma$ respectively.

The threshold voltages are changed, for example, by ion implantation, by electric lever, or by changing the dimensions, either the width W of the channel and/or its length L.

As the representative conditions in the most restricting cell are simulated in the mirror column, the power supply voltage VDDMMOCK for the mirror cell cores is then gradually decreased until writing in the activated mirror cells is detected.

This variation operation in the power supply voltage VDDMMOCK for the mirror cells is achieved by a feedback loop.

The feedback loop is connected to at least one of the internal nodes BLTiMOCK, BLFiMOCK for the cells in the mirror column. And, as represented in FIG. 1b, the feedback loop is preferably connected to both internal nodes BLTiMOCK, BLFiMOCK.

Figure 2:
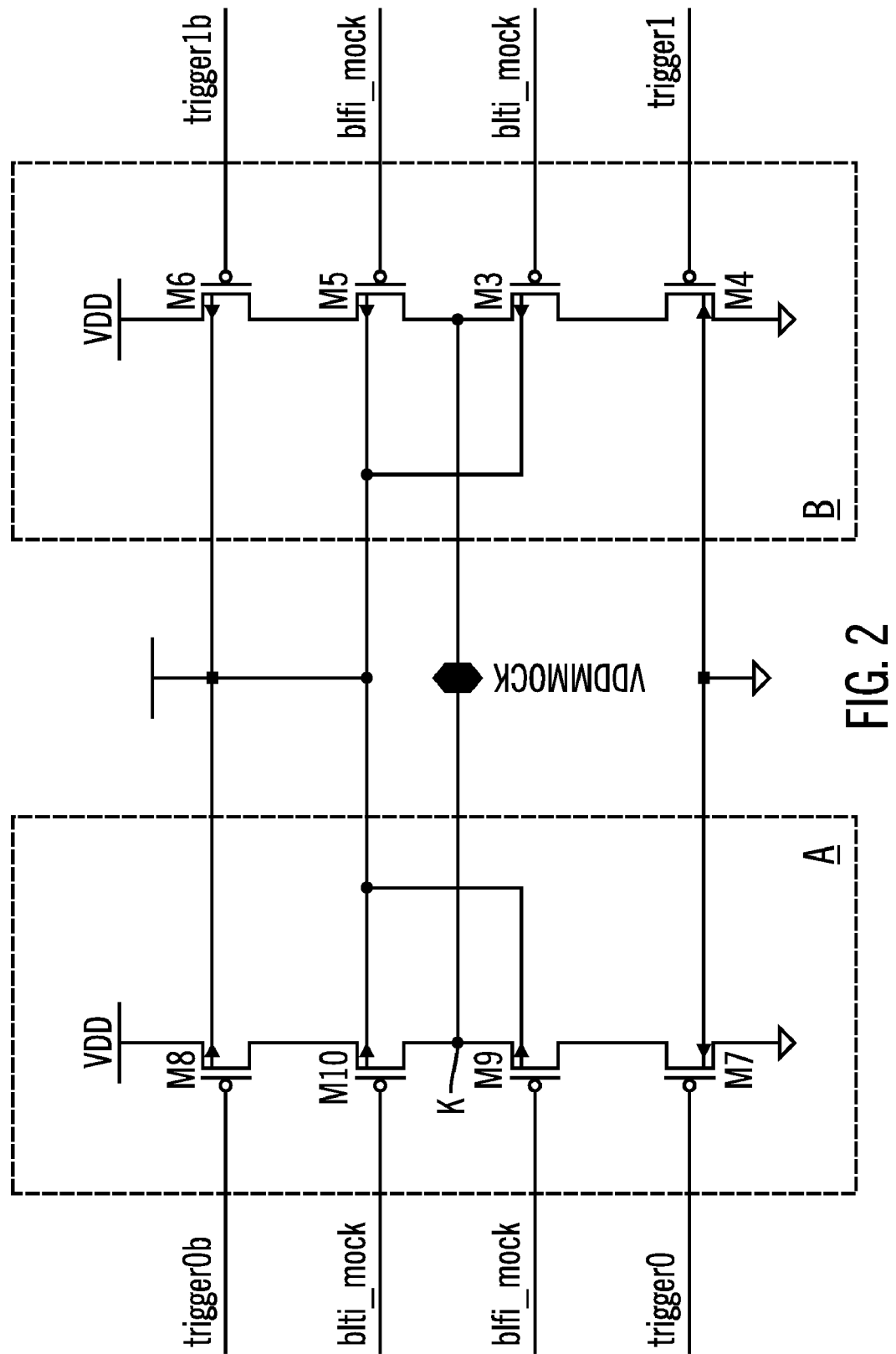
FIG. 2 is a diagrammatic representation of an embodiment of a feedback loop according to the invention.

The preferred embodiment of a feedback loop AFL is represented in FIG. 2.

In this preferred embodiment, the feedback loop comprises a symmetric structure, represented by the two branches A and B in FIG. 2. Thus, to simplify the present specification, only branch A may be described.

Branch A comprises four transistors in series. The first transistor M8 (PMOS) has its source connected to the device power supply VDD. Symmetrically, the fourth transistor M7 (NMOS) has its source connected to ground. These transistors are controlled respectively by complementary control signals trigger0b and trigger0. These transistors allow to select of branch A and participate respectively in the charge and discharge path, as described later.

The second transistor M10 (PMOS) and the third transistor M9 (PMOS) allow to generate the variation in voltage VDDMMOCK for the mirror column, thanks to the contact point K between the power supply source VDDMMOCK and the transistors M9 and M10, as described below.

These transistors M9 and M10 are respectively controlled by the control voltages BLFiMOCK and BLTiMOCK described previously.

To simplify the present specification, only the case where, at the cycle start, the logical value of BLFiMOCK equals at 0 and that of BLTiMOCK equals 1 is described below.

These arbitrary initial conditions are opposing for transistors M3 and M5. Furthermore, the implementation of this branch B requires the activation of transistors M4 and M6 through the signals trigger1 and trigger1b respectively.

It should be noted that another embodiment consists in alternating the use phases for branches A and B. This tends to minimize the consumption of dynamic power absorbed by the mirror column.

At the initial time, the voltage of the mirror column VDDMMOCK is equal to the circuit power supply voltage VDD. The transistor M9 is on and the transistor M10 is off. As transistor M7 is on, there is thus a discharge path from VDDMMOCK to ground.

This arrangement allows to gradually vary the voltage VDDMMOCK downwards.

The choice of the dimensioning for the branch transistors allows to adjust the discharge (or charge as described below) gradient. If the discharge gradient is too low, the write time risks being too long and if the discharge gradient is too abrupt, the voltage VDDMMOCK risks falling below the minimum retention voltage value. The dimensioning of the branch transistors depends preferably on the total capacity equivalent to the node VDDMMOCK.

Figure 3:
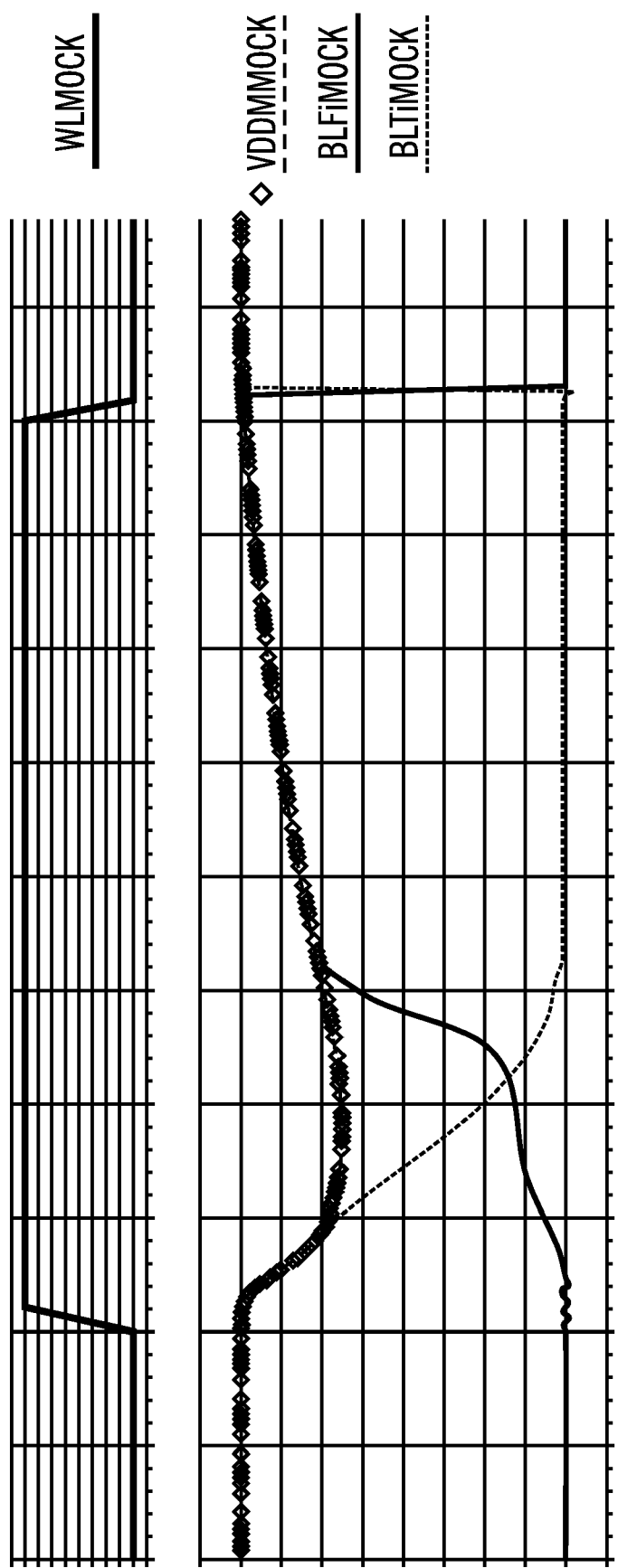
FIG. 3 is a diagrammatic representation of the dynamics of voltages at certain points of the device in an embodiment of the invention.

As represented in FIG. 3, a mirror cell is activated by the application of a control voltage on the corresponding word selection line WLMOCK thereof. This figure represents synchronously, according to an arbitrary time, the variation in the following voltages:

the control voltage for a mirror cell WLMOCK, the power supply voltage VDDMMOCK for the mirror cell selected by the control WLMOCK, the voltage BLFiMOCK at the relative internal node for that selected mirror cell, the voltage BLTiMOCK at the corresponding internal node for that selected mirror cell.

On beginning writing, the voltage VDDMMOCK gradually decreases, which promotes the write operation. In parallel, the voltage BLFiMOCK gradually increases and the voltage BLTiMOCK gradually decreases.

When the write operation is successful (cell core switching), the logical values BLTiMOCK and BLFiMOCK are inverted relative to their initial value, thus the logical value of BLFiMOCK equals 1 and that of BLTiMOCK equals 0.

In a similar way to the discharge path, the transistor M9 gradually turns off and the transistor M10 gradually turns on. The transistor M8 is already on. There is thus a conductive path (recharge) between the voltage VDDMMOCK and the voltage VDD to bring voltage for the cell VDDMMOCK gradually back to the device power supply voltage VDD once the write operation has been completed.

This arrangement allows to vary the voltage VDDMMOCK gradually upwards. In the same way as for the discharge path, the dimensioning of the transistors allows to influence the charge gradient.

The voltage VDDMMOCK, for which the emulation of the base cell having the worst write conditions in the base column switches over, may then be copied in the emulated base column, either by a direct link as represented in FIG. 1b, in which case the voltage VDDMMOCK is applied from the outset to the base column, or by a switch device.

A write operation generally concerns a set of base cells. From the start of the write cycle, the power supply voltage VDDM for those base cells is preferably equal to the power supply voltage VDDMMOCK for the mirror cells, which avoids charge redistribution problems due to the parasitic capacitances represented by the base cells in columns. The other cells in the array are powered by the voltage VDD for the device.

Once the write operation has been completed in the base column, the base column power supply VDDM is again at a read or standby voltage VDD, which is equivalent to causing the switching in FIG. 1b to change over to the power supply VDD for the device. The switch is to advantage controlled by the change in logical state of the connection lines BLTiMOCK and BLTiMOCK.

However, for a base cell in a base column, when the voltage VDDM varies, in particular by copying the voltage VDDMMOCK, with all the base cells in the base column being powered by that voltage VDDM, even those cells which are not addressed are subjected to that variation.

There is thus a risk that the power supply voltage VDDM might reach the retention voltage value for one or more non-addressed cells, with the risks of loss of the relevant information, as seen previously.

To limit this risk and to promote the write operations, the invention also relates to another embodiment in which the invention further comprises the means for creating an overvoltage on at least one line of bits.

This embodiment can be combined with the other embodiments described previously.

However, this embodiment may be implemented in combination with the variation in the power supply voltage VDDM for the base column for a base cell selected for the storage of information, without this necessarily having to be implemented by the emulation means described previously.

Thanks to the overvoltage on at least one line of bits, the power supply voltage VDDM for the selected base column (which may be emulated) related to that line of bits doesn't need to go as low as in the absence of the overvoltage, which thus limits the risks of reaching the retention voltage value.

That is to say that one can define VDDM_min, the minimum power supply voltage on the base column selected to provide for a write operation when the overvoltage means are not implemented, and VDDM_min_boost, the minimum voltage on the base column selected to provide for a write operation when the overvoltage means are implemented.

As an example, for certain memories, the retention voltage value Vret is Vret=0.7 V. To guarantee the retention, we must have VDDM_min>=Vret. If the decrease in voltage δVDDM required for a write operation (when the overvoltage means are not implemented) is 200 mV, the minimum power supply voltage VDD_min is then VDD_min=Vret+δVDDM, i.e., VDD_min=0.9 V.

When the overvoltage means are implemented, we have δVDDM_boost, the decrease in voltage required for a write operation.

For a given cell, we have δVDDM_boost<δVDDM, that is to say that for a single cell the decrease in voltage required for a write operation when the overvoltage means are implemented is less than that required for a write operation when the overvoltage means are not implemented.

In this particular case, for the cell referred to above, the decrease in voltage required for a write operation when the overvoltage means are implemented is δVDDM_boost=100 mV.

Thus, in this example, for a power supply voltage VDD_min of 0.9V, we have VDDM_min_boost=VDD_min−δVDDM_boost, i.e., VDDM_min_boost=0.8V. This is greater than the retention voltage Vret=0.7 V.

Alternatively, the implementation of the overvoltage means allows to retain a minimum voltage value VDDM_min_boost equal to the retention voltage Vret and consequently powering the cell at a power supply voltage VDD_min=0.8V.

The implementation of the overvoltage means thus allows to configure the RAM information storage system either by decreasing the power supply voltage VDD, or by increasing the minimum voltage VDDM_min required for a write operation (VDDM_min_boost>VDDM_min).

However, the generation of negative voltages is preferably limited in amplitude (diode false triggering). In addition, if all the configurations of write-difficult memory cells are considered, it seems that writing for some is facilitated in a more optimal way by the emulation means, whereas the writing of other cells is facilitated in a more optimal way by the implementation of the overvoltage means.

The present invention thus combines to advantage both the above-mentioned means.

Through the invention, memories operating at even lower power supply voltages VDD can thus be created since the decrease in voltage to facilitate the write operations is smaller on account of the negative overvoltage on at least one line of bits.

The SRAM memory information storage device according to the invention is preferably a memory of hierarchic and paginated type, that is to say comprising a set of component sub-blocks in which the lines of bits are derived.

Figure 4:
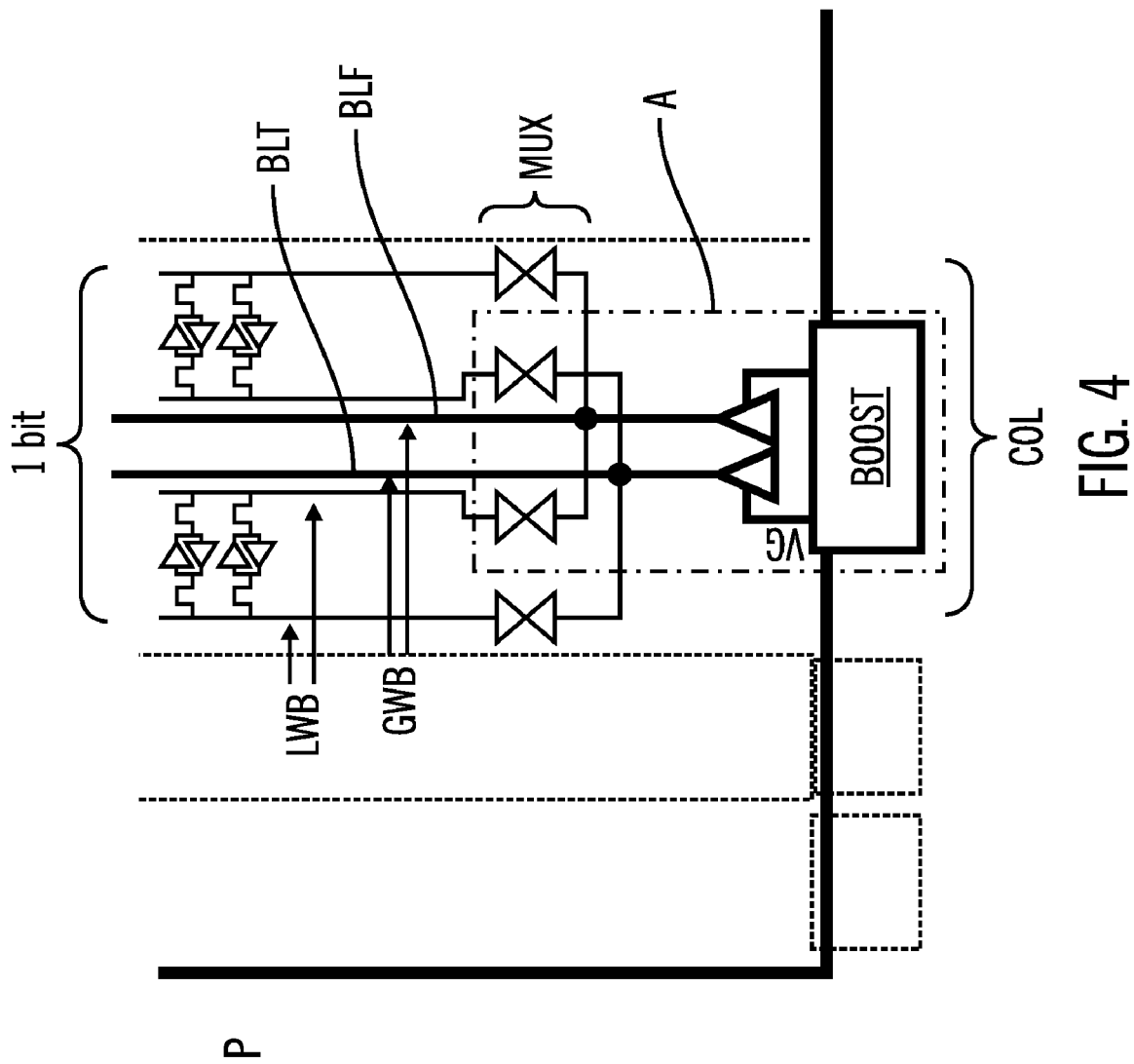
FIG. 4 illustrates an embodiment of the device according to the invention comprising means for creating an overvoltage on at least one line of bits, FIG. 5 gives a more detailed illustration of certain parts of FIG. 4.

FIG. 4 illustrates diagrammatically such a type of memory, with the zone P representing the periphery of the device.

The multiplexed organization of the memory allows to distribute the sub-blocks in accordance with specific configurations. Thus a column COL in the sense of the present invention corresponds physically to a set of one or more columns multiplexed by multiplexing means MUX located preferably at local level, that is to say sub-blocks.

In this configuration, the memory information storage device comprises lines of bits BLT and BLF at global level GWB, which are distributed by multiplexing means at local level LWB.

For the purposes of clarity, FIG. 4 only illustrates a pair of lines of bits BLT, BLF at global level and only four base cells. The configuration illustrated can be reproduced on other base columns, illustrated by dotted lines.

Each storage device information bit is preferably associated with a pair of lines of bits BLT, BLF and associated with means for creating an overvoltage BOOST on at least one respective line of bits.

According to the invention, the means for creating an overvoltage BOOST on at least one line of bits are associated at global level.

The means for creating an overvoltage BOOST are connected to at least one line of bits by a connection line VG (for virtual ground).

Figure 5:
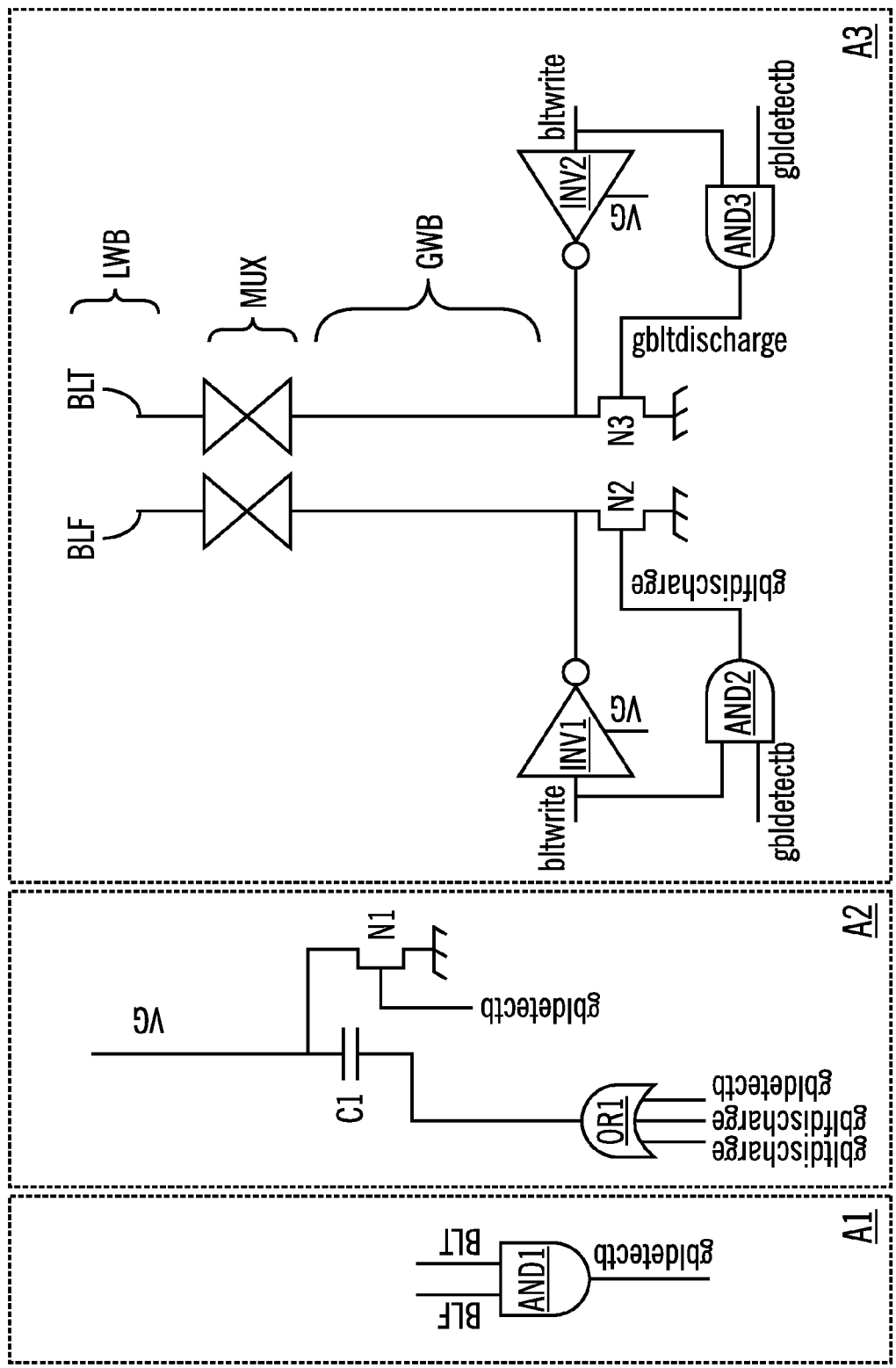

FIG. 5 illustrates more specifically a part of zone A in FIG. 4.

For greater clarity, zone A in FIG. 4 is subdivided into 3 sub-zones A1, A2 and A3. The sub-zones are connected to each other through connection lines. Thus, a connection line common to several sub-zones bears the same name in each sub-zone in question.

As a reminder, for a write operation, the two lines of bits BLT, BLF are first both pre-charged at 1 and one of them is brought to 0 depending on whether the value to be written is a logical 1 or 0. This line of bits BLF, BLT is set to 0 through a transistor, in this particular case NMOS, respectively N2 or N3 in the sub-block A3.

At a first level (sub-zone A1), the lines of bits BLT, BLF are connected at the input of a logical AND gate AND1. The gate AND1 allows to detect the change to 0 of one of the two lines of bits since it generates an output signal gbldetectb for which the value changes to 0 when one of the two lines of bits changes to 0.

Either the name of the line or the name of the signal passing through that line are referred to.

This gate AND1 preferably has a relatively low trigger threshold so as to detect the change to 0 as late as possible.

When the output signal gbldetectb is at 0, it cuts the pre-charge (transistor NMOS N1 in sub-block A2) on the capacitor C1. Similarly, it turns off the transistors N2 and N3 (sub-blocks A3) via the gates AND2 and AND3 respectively and the connection lines gblfdischarge and gbltdischarge respectively.

Moreover, the output signal gbldetectb is also connected at the input of a three-input OR gate OR1 (sub-block A2) for which the other two are constituted of signals gblfdischarge and gbltdischarge.

The gate OR1 output is connected to one of the terminals of the capacitor C1.

The other terminal of the capacitor C1 is connected to the transistor N1 (sub-block A2) and generates the signal VG (virtual ground).

The signal VG is distributed to the inverters INV1 and INV2 (sub-block A3) for which the input signals blfwrite and bltwrite respectively are the control signals which define the writing of a logical 1 or 0.

The BOOST means to create an overvoltage, in this particular case negative, are activated when the three gate OR1 inputs are at 0: the connections between lines of bits at global level GWB distributed at local level LWB and the ground are cut when the overvoltage means are implemented so as to have maximum efficiency. In connection with FIG. 4, the BOOST means in FIG. 4 correspond substantially to the sub-block A2 in FIG. 5.

Figure 6:
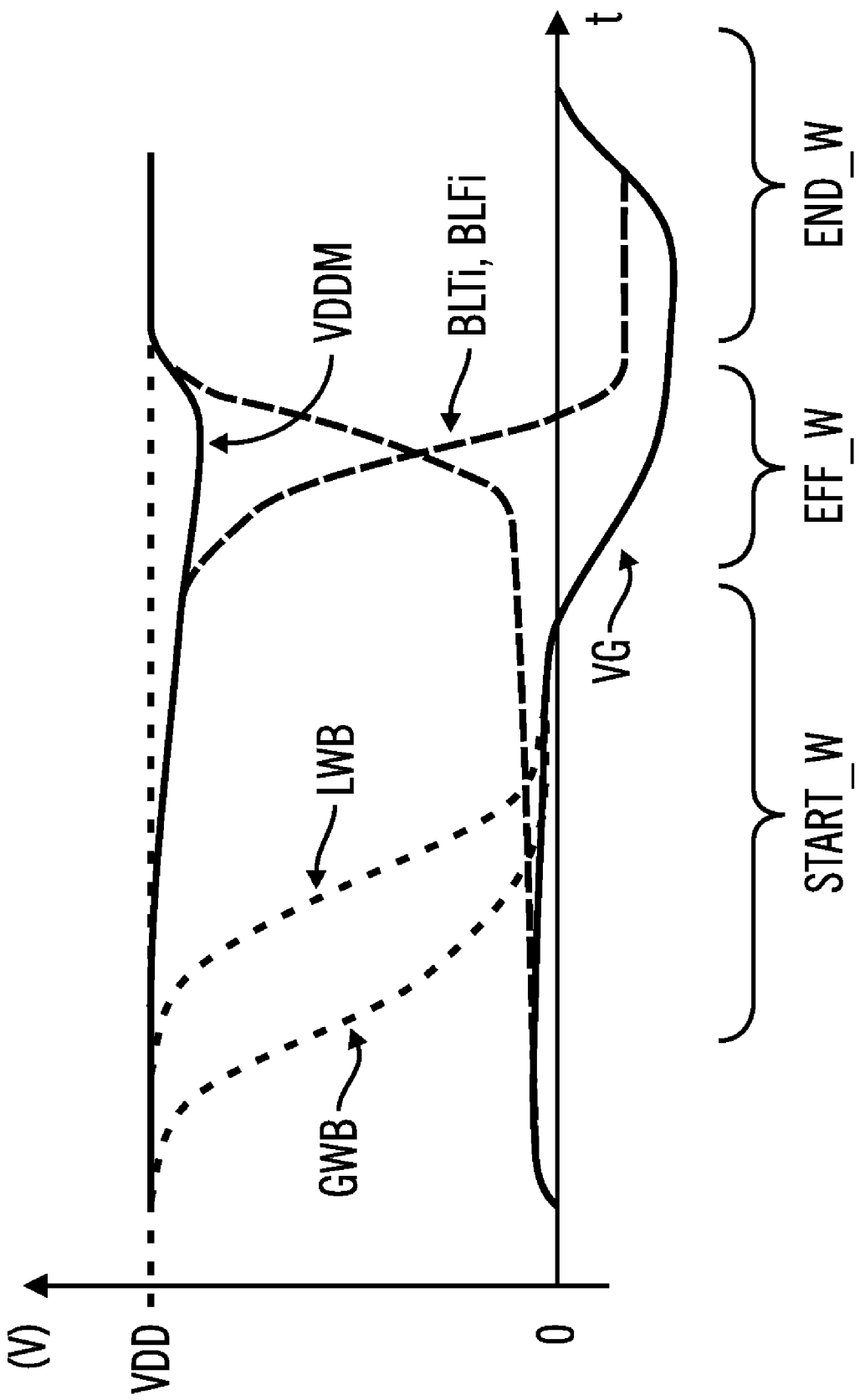
FIG. 6 illustrates the dynamics of the voltages at certain points of the device comprising means for creating an overvoltage on at least one line of bits according to the invention.

As regards dynamics, FIG. 6, the evolution in the voltage in Volts (V) for several signals have been represented in accordance with an arbitrary time t for a difficult-write cell.

The signal GWB corresponds to a voltage on the bit line concerned by a write operation at global level (the other remaining at the VDD value).

The signal LWB corresponds to a voltage on the bit line concerned by a write operation at local level. The time shift between the signals GWB and LWB is caused by the multiplexing MUX.

In a first phase START_W corresponding to the start of writing, the bit line concerned (GWB, LWB) by the write operation changes to 0 and the cell power supply voltage VDDM starts to decrease.

When the bit line is at 0, this value is detected, as seen previously, and the signal VG moves into negative values, which facilitates the write operations.

In a second phase EFF_W, the writing effectively takes place (switching of the internal nodes for the cell BLTi, BLFi), and the cell power supply voltage VDDM reaches its minimum VDDM_min.

In a third phase, END_W, the writing comes to an end: the cell power supply voltage VDDM returns to the value of the power supply voltage VDD and the value of the signal VG returns to 0.

What is claimed is:

1. A method for implementing an SRAM memory information storage device organized in an array of base cells, the method comprising the steps of:
    selecting a base cell in a base column for information storage;
    emulating, in a mirror column comprising at least one mirror cell provided with internal nodes, a most restricting cell in the base column comprising the selected base cell;
    applying to the mirror column a mirror power supply voltage at an initial voltage level;
    gradually decreasing the mirror power supply voltage until detecting the switching of at least one of the mirror cells in the mirror column;
    copying the mirror power supply voltage in the base column; and
    after the copying step, gradually increasing the mirror power supply voltage up to the initial voltage level.

2. The method according to claim 1, wherein the emulating step comprises placing a number P of mirror cells in parallel, the mirror cells placed in parallel being selectively activated by a number N of access transistors.

3. The method according to claim 2, wherein the ratio N/P between the number of activated access transistors and the number of mirror cell placed in parallel depends on a supply voltage of the storage device.

4. The method according to claim 2, wherein P and N are different numbers.

5. The method according to claim 1, wherein the emulating step comprises:
    for at least one transistor for at least one mirror cell, creating a threshold voltage which is different from that for a transistor of the same type in a base cell.

6. The method according to claim 1, wherein the decrease of the mirror power supply voltage is achieved by a feedback loop connected to at least one of the internal nodes.

7. The method according to claim 1, further comprising the step of creating an overvoltage on at least one line of bits, the one line of bits being set to a 0 logical state before creating the overvoltage.

8. The method according to claim 7, further comprising the step of:
    pre-charging the at least one line of bits,
    wherein the step of creating the overvoltage comprises creating the overvoltage on the one line of bits in the base column comprising the selected base cell after pre-charging of the at least one line of bits has ended.

9. A method of implementing an SRAM memory information storage device organized in an array of base cells, the method comprising the steps of:
    selecting a base cell in a base column for information storage;
    applying a power supply voltage at an initial voltage level;
    gradually decreasing the power supply voltage until detecting the switching of the base cell;
    after the gradually decreasing step, gradually increasing the power supply voltage up to the initial voltage level; and
    creating an overvoltage on at least one line of bits, the one line of bits being set to a 0 logical state before creating the overvoltage.

10. The method according to claim 9, further comprising the step of emulating, in a mirror column comprising at least one mirror cell provided with internal nodes, a most restricting cell in the base column comprising the selected base cell.

11. The method according to claim 10, wherein the emulating step comprises placing a number P of mirror cells in parallel, the mirror cells placed in parallel being selectively activated by a number N of access transistors.

12. The method according to claim 10, wherein the emulating step comprises:
    for at least one transistor for at least one mirror cell, creating a threshold voltage which is different from that for a transistor of the same type in a base cell.

13. The method according to claim 9, further comprising the step of:
    per-charging the at least one line of bits,
    wherein the step of creating the overvoltage comprises creating the overvoltage on the one line of bits in the base column comprising the selected base cell after pre-charging of the at least one line of bits has ended.

14. The method according to claim 7, wherein the overvoltage created on the at least one line of bits is a negative overvoltage.

15. The method according to claim 7,
    wherein the selected base cell is associated with a pair of lines of bits, and
    the step of creating the overvoltage comprises creating the overvoltage after the pair of lines of bits are at values to be written to internal nodes of the selected base cell.

16. The method according to claim 9, wherein the overvoltage created on the at least one line of bits is a negative overvoltage.

17. The method according to claim 9,
    wherein the selected base cell is associated with a pair of lines of bits, and
    the step of creating the overvoltage comprises creating the overvoltage after the pair of lines of bits are at values to be written to internal nodes of the selected base cell.

* * * * *